(12) United States Patent
Cho

(10) Patent No.: US 6,908,823 B2
(45) Date of Patent: Jun. 21, 2005

(54) METHOD OF MANUFACTURING A SEMICONDUCTOR DEVICE

(75) Inventor: Yong Soo Cho, Daejeon-Metropolitan (KR)

(73) Assignee: Dongbuanam Semiconductor Inc., Seoul (KR)

( * ) Notice: Subject to any disclaimer, the term of this patent is extended or adjusted under 35 U.S.C. 154(b) by 0 days.

(21) Appl. No.: 10/737,987

(22) Filed: Dec. 18, 2003

(65) Prior Publication Data

US 2004/0132244 A1 Jul. 8, 2004

(30) Foreign Application Priority Data

Dec. 30, 2002 (KR) .................. 10-2002-0087287

(51) Int. Cl.[7] ............................................. H01L 21/336
(52) U.S. Cl. ...................... 438/303; 438/300; 438/301; 438/305; 438/514
(58) Field of Search .................... 438/231, 300, 438/301, 303, 305, 514, 527, 978

(56) References Cited

U.S. PATENT DOCUMENTS

| | | | |
|---|---|---|---|
| 5,079,180 A | * | 1/1992 | Rodder et al. .............. 438/297 |
| 5,319,232 A | | 6/1994 | Pfiester |
| 6,025,242 A | * | 2/2000 | Ma et al. .................... 438/303 |
| 6,156,613 A | * | 12/2000 | Wu ............................. 438/300 |
| 6,232,641 B1 | * | 5/2001 | Miyano et al. ............. 257/382 |
| 6,350,656 B1 | * | 2/2002 | Lin et al. .................... 438/302 |
| 6,521,502 B1 | | 2/2003 | Yu |

FOREIGN PATENT DOCUMENTS

EP    0 984 487 A2    3/2000

\* cited by examiner

*Primary Examiner*—Amir Zarabian
*Assistant Examiner*—Khanh Duong
(74) *Attorney, Agent, or Firm*—Pillsbury Winthrop Shaw Pittman, LLP

(57) ABSTRACT

The present invention relates to a method of manufacturing a semiconductor device. According to the present invention, a passivation layer is temporarily formed on semiconductor substrate and a process of implanting impurities is conducted by the passivation layer as a protection mask, thereby inducing damages of substrate due to ion implantation processes to be minimized.

According to the present invention, implantation of impurities depends on thickness of the passivation layer, so that it is made possible to freely control impurity implantation by controlling thickness of passivation layer. Therefore, it is made possible to control a diffusion range of the lightly doped source/drain electrode.

6 Claims, 6 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device, which may minimize damages of semiconductor substrate due to ion implantation process by using a passivation layer as a protection mask.

2. Description of the Prior Art

Recently, as the size of semiconductor devices and the channel length of transistors are rapidly reduced, various kinds of defects including a punch-through are also greatly increased in its incidence, in proportion to such reduction of the channel length.

In previous consideration of the defects such as punch-through, the prior art has proposed a method, wherein an LDD structure is formed to secure a shallow junction between a source electrode and a drain electrode of transistor, and by such LDD structure, an electric field strength between the source and drain electrodes are naturally reduced.

The shallow junction of the prior art is disclosed in U.S. Pat. No. 5,319,232 entitled "Transistor having a lightly doped drain", U.S. Pat. No. 6,521,502 entitled "Solid phase epitaxy activation process for source/drain junction extensions and halo regions", EP984,487 entitled "Method of making shallow well MOSFET structure", and so forth.

First, as shown in FIG. 1, in the prior art, a substrate 10 is provided whose active region is defined by an isolating layer 10a. A gate electrode 13 having a gate oxide layer pattern 11 and a gate poly layer pattern 12 on the active region of the substrate 10 is formed.

Then, as shown in FIG. 2, by performing an ion implantation process using the gate electrode 13 as an ion-implantation mask, impurities are lightly doped onto the substrate 10, forming a source/drain electrode 15 with low concentration for LDD structure on the substrate 10 adjacent to the gate electrode 13.

Then, as shown in FIG. 3, spacers 16 are formed on both sidewalls of the gate electrode 13.

Then, as shown in FIG. 4, by performing an ion implantation using the spacers 16 as an ion implantation mask, impurities with high concentration are implanted into the substrate 10, forming a source/drain electrode 17 with high concentration on both sides of the gate electrode 13.

Finally, certain subsequent process, such as annealing process, is performed, thus forming a semiconductor device with LDD structure, for example, a transistor.

In such prior system as described above, in order to form the LDD structure source/drain electrode 15 with low concentration, a process of implanting impurities into the substrate 10 should be preceded, so that certain impact shocks due to implantation of impurities might be applied to the surface of substrate 10, with the result that a lattice structure of partial silicon atoms constituting the surface of substrate 10 being considerably destroyed.

In this case, when certain subsequent process, for example, an annealing process, is forcedly performed without conducting separate measures, partial silicon atoms with their lattice structure destroyed due to impact shocks of impurities become separated from the surface of substrate 10 and then being scattered outside by heat applied during the annealing process, thus generating unnecessary defects such as voids on the surface of substrate 10.

Such voids continuously have a bad influence on a certain construction formed on the substrate 10, so that product quality of finally finished semiconductor devices may be degraded below a certain level unless separate measures are conducted so as to remove the voids.

SUMMARY OF THE INVENTION

Accordingly, the present invention has been made to solve the above-mentioned problems occurring in the prior art, and an object of the present invention is to minimize damages of semiconductor substrate due to an ion implantation of impurities for LDD structure by additionally and temporary forming passivation layers on a part of a semiconductor substrate and performing the ion implantation using the passivation layers as a protection mask.

In order to accomplish at least these objects, in whole or in parts, there is provided a method of manufacturing a semiconductor device, including: forming a gate electrode on a semiconductor substrate; forming a sidewall layer on both sides of the gate electrode; forming a passivation layer on a portion of the semiconductor substrate excluding the gate electrode and the sidewall layer; forming a first impurity region by implanting the impurities; forming a spacer on both sides of the sidewall layer; and forming a second impurity region by implanting the impurities using the spacer as an ion implantation mask.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
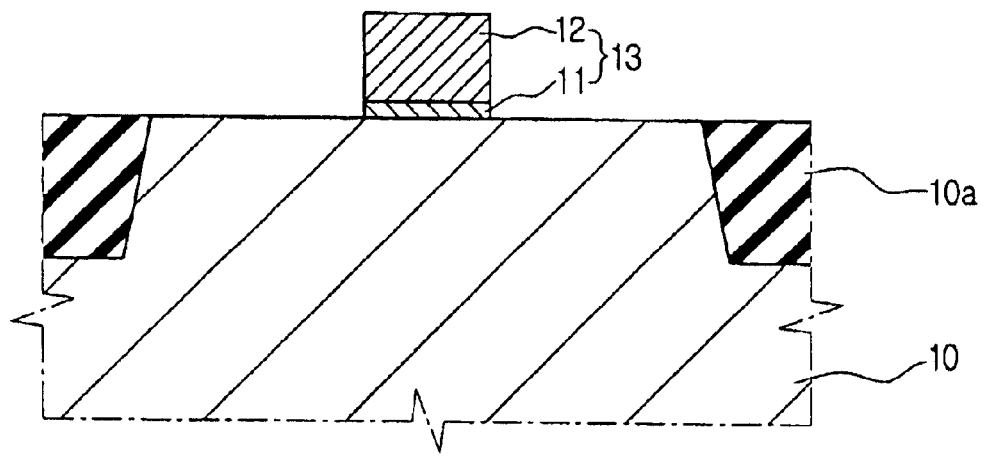
FIGS. 1 to 4 illustrate a procedure of a method of manufacturing a semiconductor device according to the prior art.
Figure 2:
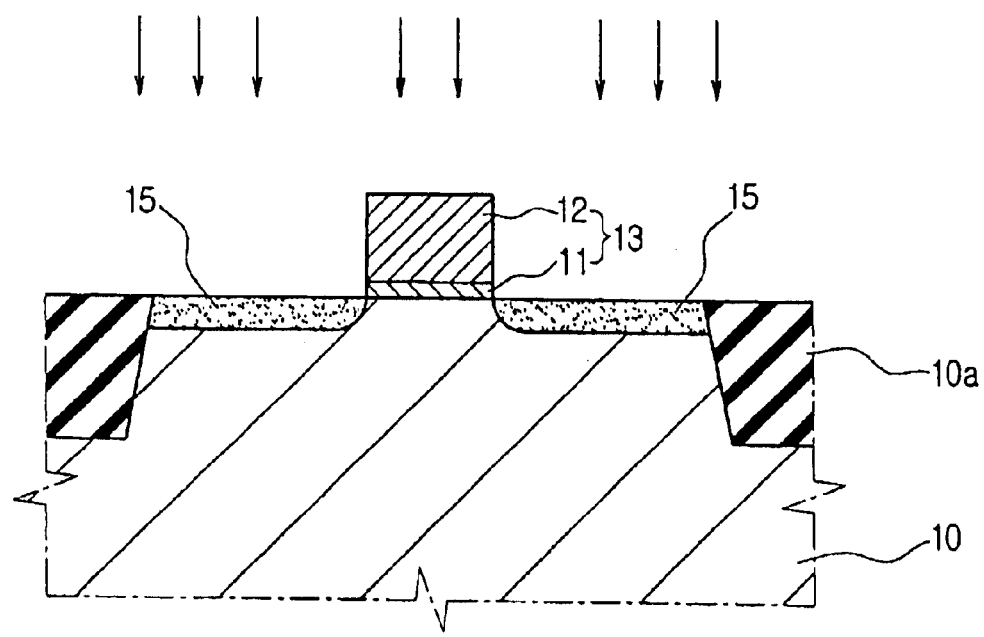
Figure 3:
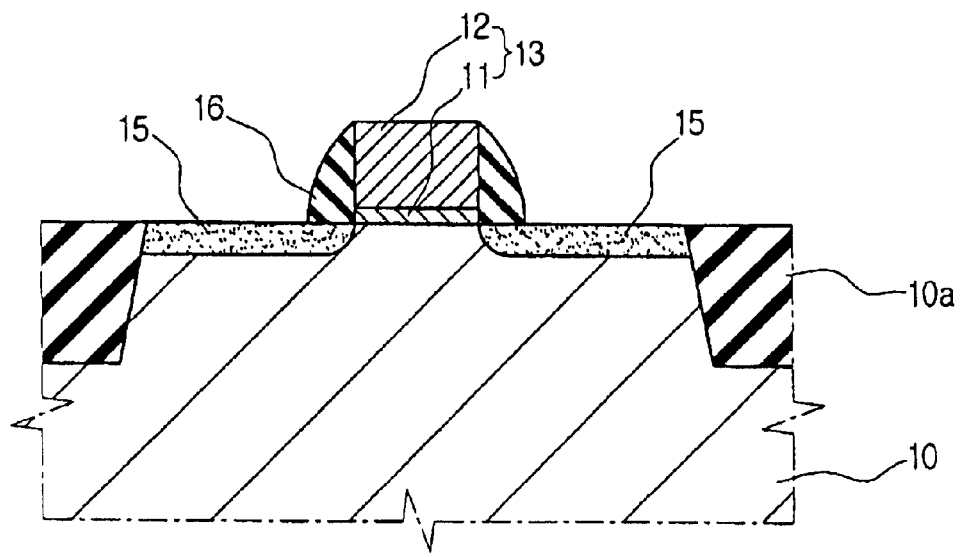
Figure 4:
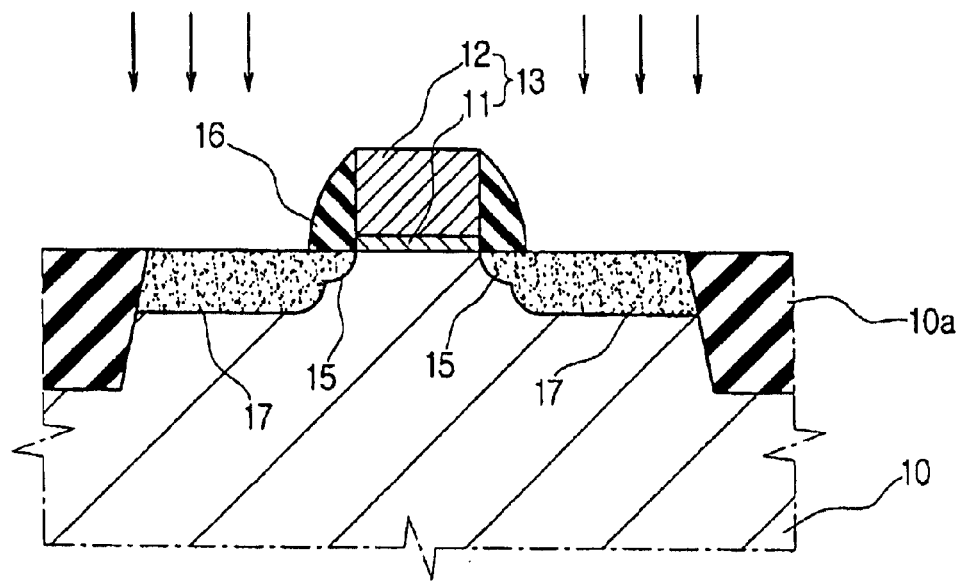

Hereinafter, a preferred embodiment of the present invention will be described with reference to the accompanying drawings. In the following description and drawings, the same reference numerals are used to designate the same or similar components, and so repetition of the description of the same or similar components will be omitted.

Figure 5:
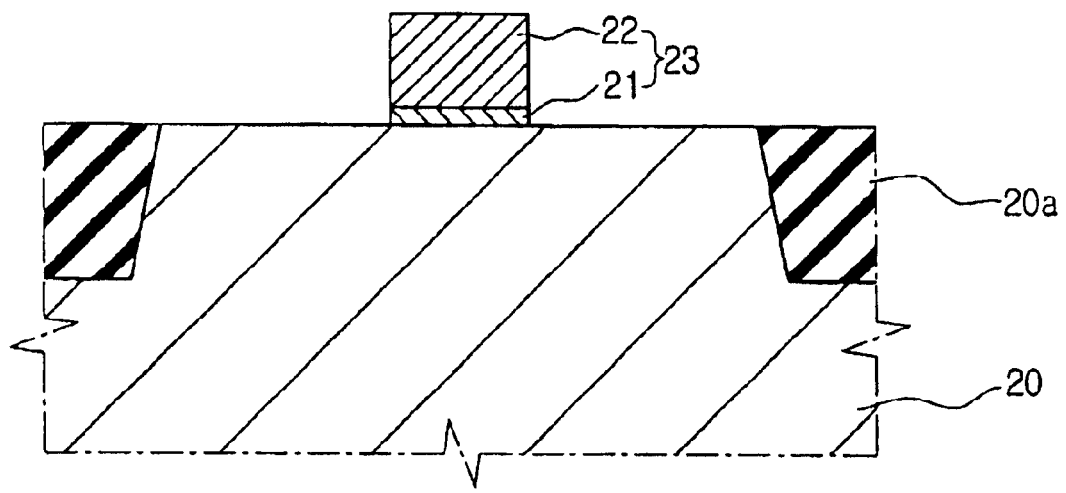
FIGS. 5 to 12 illustrate a procedure of a method of manufacturing a semiconductor device according to the embodiments of the present invention.

As show in FIG. 5, a trench is formed in a device isolating region of a substrate 20 by utilizing sacrificial layer patterns, for example, a nitride layer pattern, a sacrificial oxide layer pattern and so forth, and a gap-filling process of an insulating layer, a patterning process and so forth are further performed, thus forming a device isolating layer 20a defining an active region while being filled in the trench.

Then, a gate insulating layer and a poly silicon layer are successively deposited on the substrate 20 by a chemical vapor deposition (CVD) process, and the gate insulating layer and the poly silicon layer are collectively patterned using a photolithography, so that a gate electrode 23 having a gate insulating layer pattern, for example, a gate oxide layer pattern 21 and a gate poly layer pattern 22 is formed on a part of the active region of the substrate 20 defined by the device isolating layer 20a.

Figure 6:
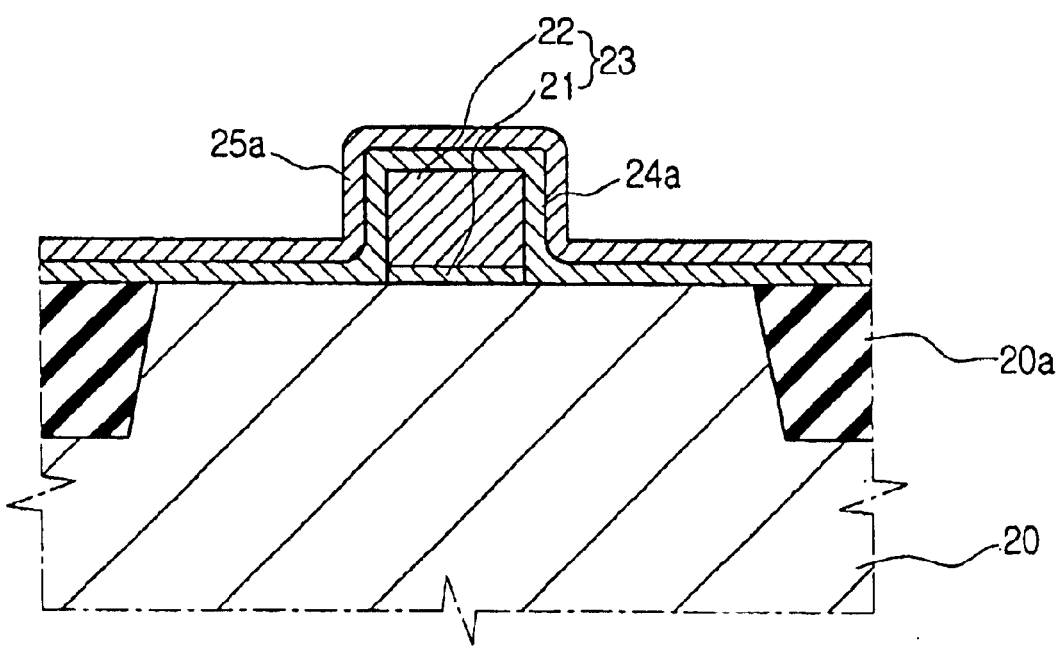

When the gate electrode 23 has been formed through the foregoing processes, using CVD process as shown in FIG. 6, a first insulating layer 24a, for example, an oxide layer, is formed on the substrate 20 to cover the gate electrode 23, and a second insulating layer 25a, for example, a nitride layer, is formed on the first insulating layer 24a.

Figure 7:
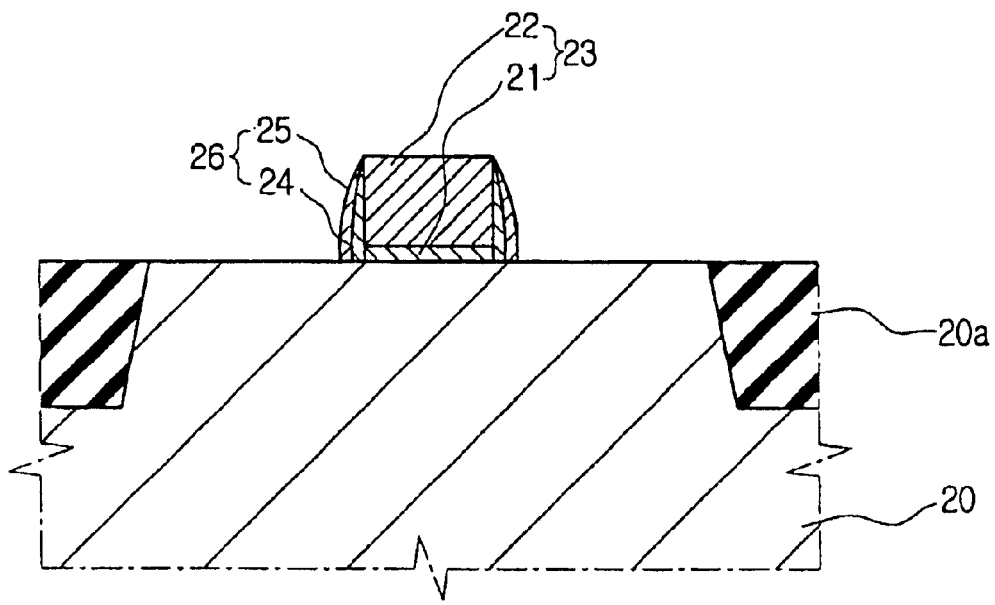

Then, as shown in FIG. 7, using a dry etching process having an anisotropic etching feature, for example, a reactive ion etching process, the first and second insulating layers 24a and 25a are selectively etched in such a way that the first and second insulating layers 24a and 25a are left only on both sides of the gate electrode 23, thus forming a sidewall layer 26 consisting of, for example, an oxide layer pattern 24 and a nitride layer pattern 25, on both sides of the gate electrode 23.

Figure 8:
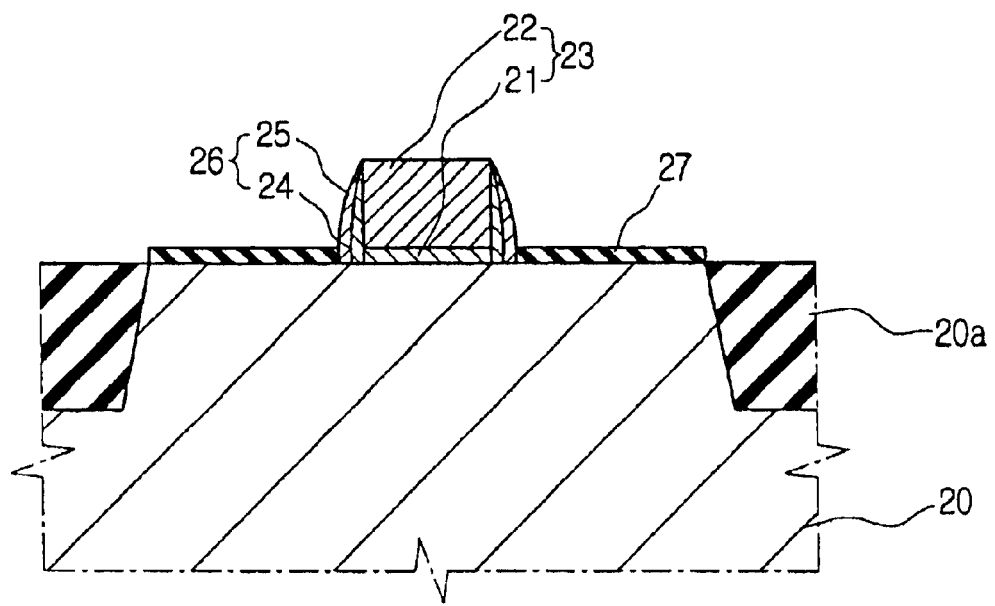

When the sidewall layer 26 has been formed through the foregoing processes, performing a selective epitaxial growth process as shown in FIG. 8, a silicon of substrate 20 is grown along a crystal axis thus to form a passivation layer 27 for substrate on the surface of the substrate 20 excluding the gate electrode 23 and the sidewall layer 26.

Preferably, the passivation layer 27 has a thickness of 100 to 200 Å.

Herein, as described above, since the sidewall layer 26 is previously formed on both sides of the gate electrode 23, the gate electrode 23 is stably maintained at normal state without being damaged even though a series of processes for forming the passivation layer 27 are severely conducted.

In this case, as described above, the sidewall layer 26 has a dual structure that the oxide layer pattern 24 and the nitride layer pattern 25 are overlapped, so that the sidewall layer can effectively perform a given function of protecting the gate electrode 23.

Figure 9:
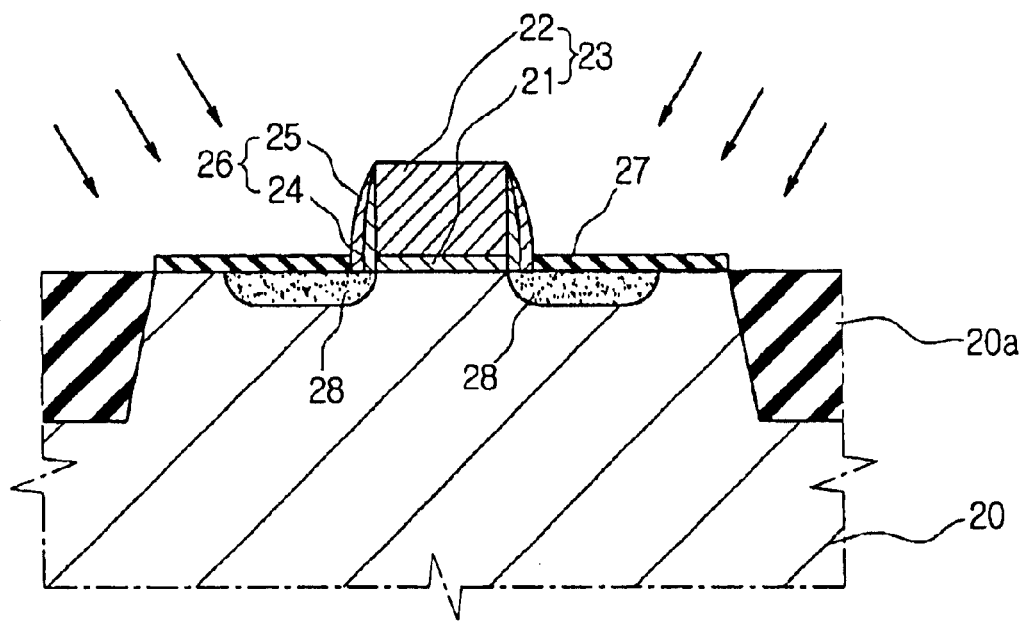

Meanwhile, when the passivation layer 27 has been formed on the surface of the substrate excluding the gate electrode 23 and the sidewall layer 26 through foregoing processes, as shown in FIG. 9, by performing an ion implantation process using the sidewall layer 26 and the passivation layer 27 as an ion implantation mask, impurities are implanted as to be lightly doped into the substrate 20, thus forming a lightly doped source/drain electrode 28 for LDD structure on both sides of the gate electrode 23.

Herein, since the passivation layer 27 has been previously formed on the surface of the substrate 20, damages applied to the substrate due to the ion implantation of impurities can be considerably reduced comparing with the prior art.

In the prior art, an implantation with low concentration of impurities into the substrate as a target should be severely preceded without separate protection means, so that certain impact shocks due to implantation of impurities might be applied to the surface of substrate, with the result that a lattice structure of partial silicon atoms constituting the surface of substrate being considerably destroyed.

However, in the present system, since the passivation layer 27 has been previously formed on the surface of the substrate 20, damages to be applied to the substrate due to the ion implantation of impurities can be considerably reduced and thus restricted to the minimum.

Herein, as described above, since the thickness of the passivation layer 27 is maintained at a certain level, preferably, 100 to 200 Å, to the extent that shocks applied to the substrate 20 may be properly mitigated, the lightly doped source/drain electrode 28 formed after the implantation process of impurities can maintain its quality corresponding to that of the conventional lightly doped source/drain electrode formed by the conventional impurity implanting process.

According to the present invention, since a state of impurity implantation might be sensitively influenced on the thickness of the passivation layer 27, the impurity implantation can be freely controlled by controlling the thickness of the passivation layer 27, thus possibly controlling a diffusion range of the lightly doped source/drain electrode 28.

As described above, in the present invention, since the sidewall layer 26 for preventing damages of the gate electrode 23 has been previously and additionally formed on both sides of the gate electrode 23, if impurities are implanted linearly without separate measures, the lightly doped source/drain electrode 28 may not be normally positioned under the sidewall layer 26 due to an interference of the sidewall layer.

Considering this problem, in the present invention, as shown in the drawings, the impurities for forming the lightly doped source/drain electrode 28 are implanted inclined toward, preferably, the gate electrode 23 at a certain angle.

Therefore, the impurities implanted into the substrate 20 as a target can be concentratedly implanted under the gate electrode 23 despite the interference of the sidewall layer 26, with the result that the finished source/drain electrode 28 can be normally positioned under the sidewall layer 26 even a severe condition that the sidewall layer has been formed.

Figure 10:
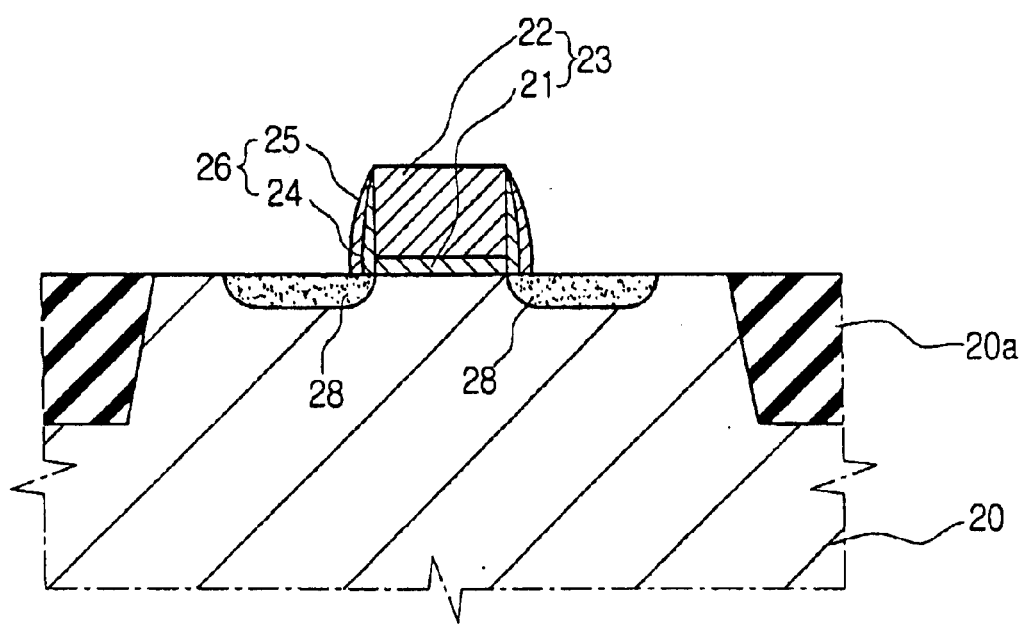
Figure 11:
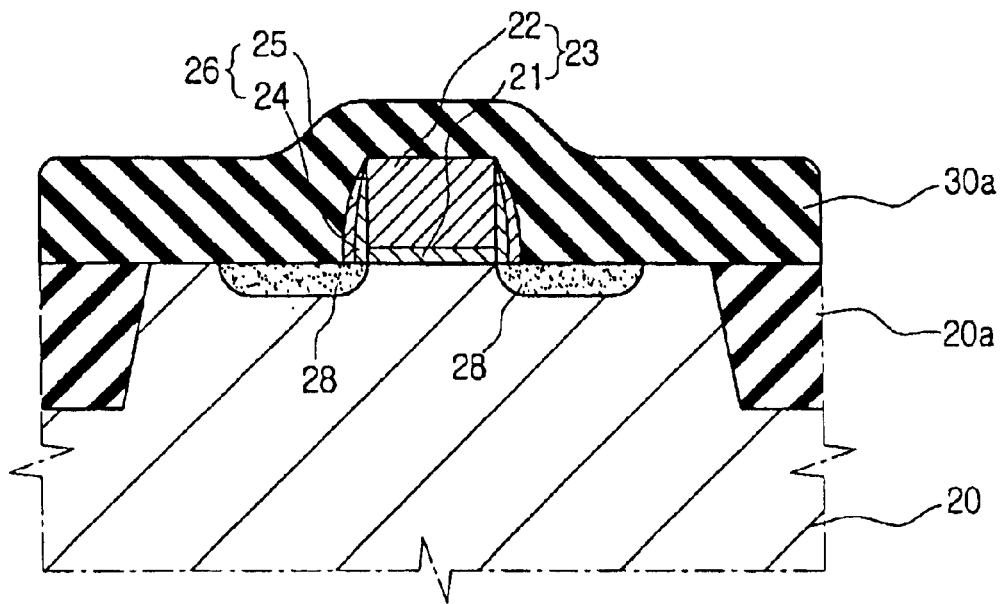

Meanwhile, when the lightly doped source/drain electrode 28 for LDD structure has been formed through processes described above, as shown in FIG. 10, the passivation layer that has been formed on both sides of the sidewall layer 26 is removed using the etching process.

In this case, since the sidewall layer 26 is previously formed on both sides of the gate electrode 23, the gate electrode 23 is stably maintained at normal state without being damaged even though a series of processes for removing the passivation layer 27 are severely conducted.

Of course, as described above, the sidewall layer 26 has a dual structure that the oxide layer pattern 24 and the nitride layer pattern 25 are overlapped, so that the sidewall layer 26 can effectively perform a given function of protecting the gate electrode 23.

Figure 12:
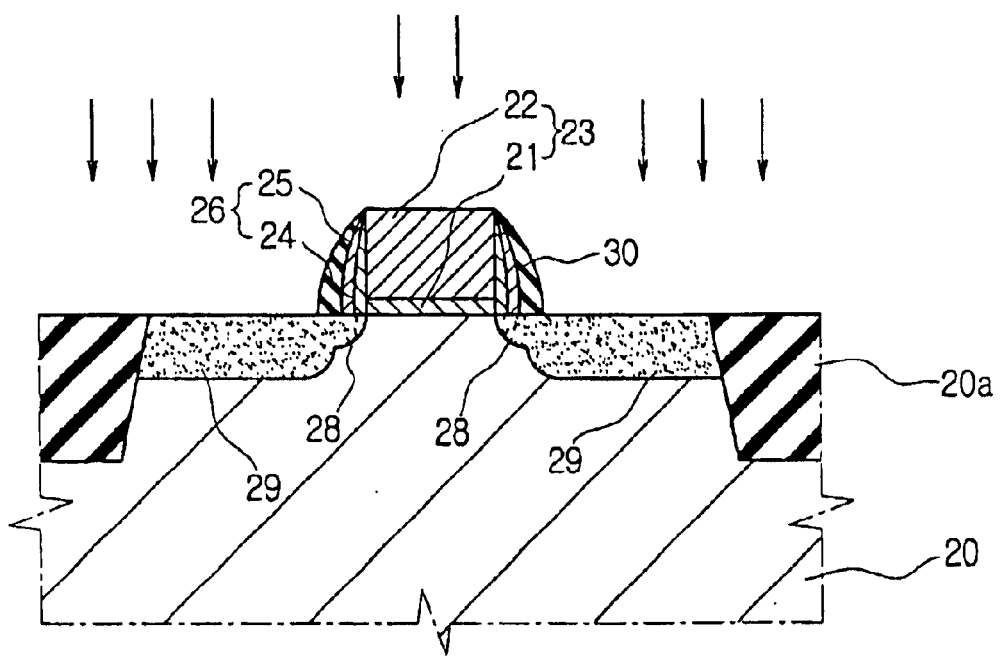

When the passivation layer 27 has been removed through the foregoing process, an insulating layer, for example, an oxide layer 30a, is formed on the substrate 20 using CVD process to cover the sidewall layer 26 and the gate electrode 23, and as shown in FIG. 12, using a dry etching process having an anisotropic etching feature, for example, a reactive ion etching process, the oxide layer 30a is selectively etched in such a way that the oxide layer is left only on both sides of the sidewall layer 26, thus forming a spacer 30 on both sides of the sidewall layer 26.

Then, by performing an ion implantation process using the spacer 30 as an ion implantation mask, impurities with high concentration are implanted into the substrate 20, thus forming a heavily doped source/drain electrode 29 on both sides of the gate electrode 23.

After foregoing processes, a certain subsequent process, for example, an annealing process, is performed so that LDD structure semiconductor devices, for example, transistors, are completely formed.

According to the aforementioned embodiments of the present invention, passivation layers are additionally and temporarily formed on a part of a semiconductor substrate and an ion implantation of impurities for a lightly doped drain (LDD) structure is performed using the passivation layers as a protection mask, thereby minimizing damages of semiconductor substrate due to the ion implantation process.

In such system of the present invention, since a state of impurity implantation might be sensitively influenced on the thickness of the passivation layer, the impurity implantation can be freely controlled by controlling the thickness of the passivation layer, thus possibly controlling a diffusion range of the lightly doped source/drain electrode.

Although preferred embodiments of the present invention have been described for illustrative purposes, those skilled in the art will appreciate that various modifications, additions and substitutions are possible, without departing from the scope and spirit of the invention as disclosed in the accompanying claims.

The entire disclosure of Korean Patent Application No. 10-2002-0087287 filed on Dec. 30, 2002 including specification, claims, drawings and summary are incorporated herein by reference in its entirety.

What is claimed is:

1. A method of manufacturing a semiconductor device, comprising:

forming a gate electrode on a semiconductor substrate;

forming a sidewall layer on both sides of the gate electrode;

forming a passivation layer on a portion of the semiconductor substrate excluding the gate electrode and the sidewall layer;

forming a first impurity region by implanting first impurities;

removing the passivation layer;

forming a spacer on both sides of the sidewall layer; and forming a second impurity region by implanting second impurities using the spacer as an ion implantation mask.

2. The in method of claim 1, wherein the passivation layer is formed by a selective epitaxial growth of the substrate.

3. The method of claim 1, wherein the passivation layer has a thickness of 100 to 200 Å.

4. The method of claim 1, wherein the first impurities are implanted inclined toward the gate electrode at a certain angle.

5. The method of claim 1, wherein said forming the sidewall layer comprises: forming a first insulating layer on the substrate to cover the gate electrode; forming a second insulating layer on the first insulating layer; and selectively etching the first and second insulating layers in such a way that the first and second insulating layers are left only on both sides of the gate electrode.

6. The method of claim 5, wherein the first insulating layer is an oxide layer and the second insulating layer is a nitride layer.

* * * * *